(12) United States Patent
Honeycutt (10) Patent No.: US 6,544,871 B1
(45) Date of Patent: Apr. 8, 2003

(54) METHOD OF SUPPRESSING VOID FORMATION IN A METAL LINE

(75) Inventor: Jeffrey W. Honeycutt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/617,967

(22) Filed: Oct. 2, 2000

Related U.S. Application Data (63) Continuation of application No. 09/653,138, filed on Aug. 31, 2000.

(51) Int. Cl.⁷ .......................................... H01L 21/3205
(52) U.S. Cl. .................. 438/586; 438/584; 438/618; 438/643; 438/644; 438/648; 438/652; 438/656; 438/685; 438/785
(58) Field of Search .................. 438/586, 656, 438/584, 618, 642, 643, 644, 648, 652, 685, 785

(56) References Cited

U.S. PATENT DOCUMENTS

| | | |
|---|---|---|
| 4,630,357 A | 12/1986 | Rogers et al. |
| 4,641,420 A | 2/1987 | Lee |
| 5,066,612 A | 11/1991 | Ohba et al. |
| 5,279,989 A | 1/1994 | Kim |
| 5,308,795 A | 5/1994 | Hawley et al. |
| 5,330,934 A | 7/1994 | Shibata et al. |
| 5,332,693 A * | 7/1994 | Kim .......................... 438/648 |
| 5,403,779 A | 4/1995 | Joshi et al. .......... 148/DIG. 15 |
| 5,529,956 A | 6/1996 | Morishita |
| 5,837,611 A | 11/1998 | Gabric et al. .................. 216/38 |
| 5,909,635 A * | 6/1999 | Marieb et al. ............... 438/625 |
| 6,175,154 B1 * | 1/2001 | Gillespie .................... 257/750 |
| 6,296,780 B1 * | 10/2001 | Yan et al. ..................... 216/67 |
| 6,329,279 B1 | 12/2001 | Lee |

* cited by examiner

Primary Examiner—Richard Elms
Assistant Examiner—Pho M. Luy
(74) Attorney, Agent, or Firm—Workman, Nydegger & Seeley (57) ABSTRACT

An interconnect line that is enclosed within electrically conductive material is disclosed. The interconnect line, which is useful for electrically connecting devices in an integrated circuit, is defined by an aluminum layer having a bottom surface covered by a titanium layer, a top surface covered by a titanium layer, and opposing side surfaces covered by discrete titanium layers. The encapsulation of the aluminum layer within the titanium layers substantially precludes void formation within the aluminum layer. The interconnect line also may be upon a contact plug that is in electrical communication with an active area in an underlying semiconductor substrate.

18 Claims, 9 Drawing Sheets

METHOD OF SUPPRESSING VOID FORMATION IN A METAL LINE

CROSS REFERENCE TO RELATED APPLICATIONS

This is a continuation application of U.S. patent application Ser. No. 09/653,138, filed on Aug. 31, 2000, titled Metal Line and Method of Suppressing Void Formation Therein, which is incorporated herein by reference.

BACKGROUND OF INVENTION

1. The Field of the Invention

The present invention relates to metal lines used for electrically connecting devices on an integrated circuit and more specifically to the formation of aluminum lines in which the void formation therein is suppressed.

2. The Relevant Technology

Integrated circuits are manufactured by an elaborate process in which a variety of different electronic devices are integrally formed on a semiconductor substrate such as a small silicon wafer. In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above. The term semiconductor substrate is contemplated to include such structures as silicon-on-insulator and silicon-on-sapphire.

Conventional electronic devices include capacitors, resistors, transistors, diodes, and the like. In advanced manufacturing of integrated circuits, hundreds of thousands of electronic devices are formed on a single wafer. One of the final steps in the manufacture of integrated circuits is to form interconnect lines between a select number of the devices on the integrated circuit. In turn, the interconnect lines are connected to leads which can then be connected to other electrical systems. The interconnect lines in conjunction with the leads allow for an electrical current to be delivered to and from the electronic devices so that the integrated circuit can perform its intended function.

The interconnect lines generally comprise narrow lines of aluminum. Aluminum is typically used because it has a relatively low resistivity, good current-carrying density, superior adhesion to silicon dioxide, and is available in high purity. Each of these properties is desirable in interconnect lines since they result in a quicker and more efficient electronic circuit.

The computer industry is constantly under market demand to increase the speed at which integrated circuits operate and to decrease the size of integrated circuits. To accomplish this task, the electronic devices on a silicon wafer are continually being increased in number and decreased in size. In turn, the size of the interconnect lines must also be decreased.

As the interconnect lines get smaller, however, a phenomenon referred to as "void formation" has been found to occur more frequently. In general, void formation is a process in which minute voids formed within the aluminum line coalesce on the boundaries of the aluminum line. As a result of the coalescing of the voids, the aluminum line begins to narrow at a specific location. If the aluminum line gets sufficiently narrow, the line can burn out so as to cause an open in the line. The open prevents the integrated circuit from operating in a proper manner.

Void formation is generally caused by either electromigration or stress migration. Electromigration occurs as an electrical current flows through an aluminum line. When a voltage is applied across an aluminum line, electrons begin to flow through the line. These electrons impart energy to the aluminum atoms sufficient to eject an aluminum atom from its lattice site. As the aluminum atom become mobile, it leaves behind a vacancy. In turn, the vacancy is also mobile since it can be filled by another aluminum atom which then opens a new vacancy. In the phenomenon of electromigration, the vacancies formed throughout the aluminum line tend to coalesce at the grain boundaries of the aluminum line, thereby forming voids that narrow the interconnect line as discussed above. Once the interconnect line is narrowed, the current density passing through that portion of the line is increased. As a result, the increased current density accelerates the process of electromigration, thereby continually narrowing the line until the line fails.

It is also thought that void formation occurs as a result of stress migration inherent in aluminum line deposition. The deposition of the aluminum lines is usually done at an elevated temperature. As the aluminum cools, the aluminum begins to contract. An insulation layer positioned under the aluminum layer, typically silicon dioxide, also contracts. The aluminum and the silicon dioxide have different coefficients of thermal expansion and contraction such that the two materials contract at different rates. This contraction sets an internal stress within the aluminum line. The same phenomenon can also occur when a subsequent layer is formed over the top of the aluminum line. It is theorized that the energy resulting from the induced stress within the aluminum causes displacement of the aluminum atoms and coalescence of the resulting vacancies.

Figure 1:
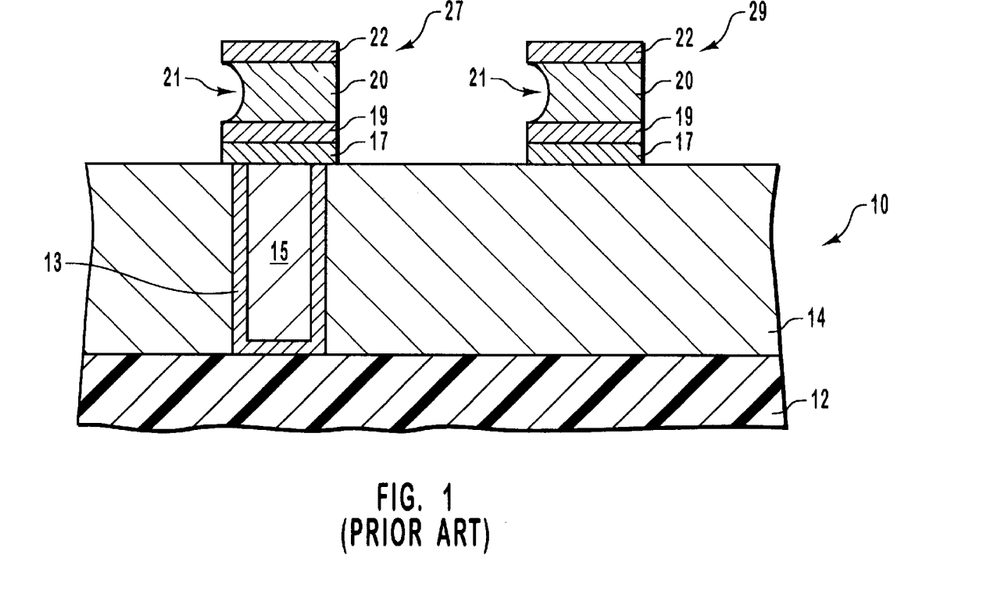
FIG. 1 is a cross-sectional view of a semiconductor substrate having a series of metal lines deposited thereon, each of which has a void formed in an exposed layer of aluminum that is caused by stress migration.

FIG. 1 illustrates the problem of voids in exposed interconnect lines that are composed of aluminum. A semiconductor structure 10 is seen in FIG. 1 that includes a silicon substrate 12, a insulating layer 14, and interconnect lines 27 and 29 on insulating layer 14. Silicon substrate 12 has an active area therein to which a contact is made by a plug 15 having a liner 13 thereover. Plug 15 is preferably composed of aluminum or tungsten, and liner 13 is preferably composed of titanium nitride or a combination and titanium and titanium nitride. Upon insulating layer 14 is layer 17 composed of titanium and layer 19 composed of titanium aluminide. A layer 20 is composed aluminum and a layer 22 is composed of titanium nitride. Interconnect lines 27 and 29 have been patterned as illustrated.

A void 21 is seen in aluminum layer 20. The occurrence of a high mechanical stress field in aluminum layer 20 initiates the formation of void 21. Consequently, there is a coalescing of vacancies in the aluminum grain in the high mechanical stress field. Temperatures common in fabrication processes also aggregate the voiding problem. If a voiding problem occurs due to stress migration, electromigration effects will be accelerated in the void location due to the higher current density under operating conditions.

In one attempt to eliminate void formation, the aluminum is mixed with another metal to form an aluminum alloy. For example, copper has been added to aluminum. In turn, the copper appears to increase the energy required to cause the voids to form in the line. This remedy, however, is only partial since void formation still occurs over time, especially as the size of the aluminum line decreases.

What is needed in the art is an effective method and structure to prevent void formation due to stress migration, electromigration, and related problems.

SUMMARY OF INVENTION

The present invention includes an inventive method of forming a conductively clad interconnect line structure. The interconnect line structure is fabricated by forming a first refractory metal layer upon a electrically insulative substrate. A metal layer is then formed upon the first refractory metal layer. Co-planar opposing sides are formed on both the first refractory metal layer and the metal layer, and a second refractory metal layer is conformally formed upon both the metal layer and the first refractory metal layer. Then, spacers are formed from the second refractory metal layer on the co-planar opposing sides on the first refractory metal layer, where the second refractory metal layer covers the metal layer.

The present inventive also includes a conductively clad interconnect line structure that includes a first refractory metal layer upon a electrically insulative substrate, a metal layer upon the first refractory metal layer, where there are co-planar opposing sides on both the first refractory metal layer and the metal layer, and a spacer, composed of a second refractory metal layer, on each of the co-planar opposing sides on the first refractory metal layer, where the second refractory metal layer covers the metal layer.

The present invention provides an improved interconnect line for connection to an electronic device within an integrated circuit. The interconnect line is an electrically conductive layer, such as an aluminum layer, positioned on the integrated circuit and having an exterior surface defined by a bottom surface, a top surface, and opposing side surfaces. A discrete bottom metal layer is secured to and substantially covers the bottom surface of the electrically conductive layer. A discrete top metal layer is secured to and substantially covers the top surface of the electrically conductive layer. Finally, discrete metal sidewall spacers individually attach to and substantially cover each of the opposing side surfaces of the electrically conductive layer. In this embodiment, the electrically conductive layer is substantially encased by the bottom metal layer, top metal layer, and sidewall spacers. In a preferred embodiment, the bottom metal layer, top metal layer, and sidewall spacers are made from a refractory metal or nitrides thereof, preferably titanium or a titanium compound such as a nitride of titanium. By encasing the electrically conductive layer within such metals, or metal compounds, the effect of void formation is significantly reduced. A refractory metal for purposes of the invention described herein includes chromium, cobalt, molybdenum, platinum, tantalum, titanium, tungsten, zirconium, or combinations thereof.

The present invention also discloses a method for forming an inventive interconnect line for connection to an electronic device within an integrated circuit. Such an interconnect line is formed by initially depositing a first refractory metal layer on an integrated circuit formed on a semiconductor substrate. Next, an electrically conductive layer is deposited over the first refractory metal layer. A second refractory metal layer is then deposited over the electrically conductive layer.

Photolithography, which can be aided by an antireflective coating that is formed on the interconnect line, and etching are then used to further define the interconnect line. The etching removes portions of the first refractory metal layer, the electrically conductive layer, and the second refractory metal layer so as to form a narrow interconnect line having overlying portions of the first refractory metal layer, the electrically conductive layer, and second refractory metal layer. The interconnect line is in part defined by having opposing side surfaces where the electrically conductive layer is openly exposed.

Next, a third refractory metal layer is deposited over the semiconductor substrate to cover the interconnect line. A portion of the third refractory metal layer covers the side surfaces of the interconnect line.

Finally, anisotropic etching is used to remove the third refractory metal layer not covering the side surface of the interconnect line. As a result, the electrically conductive layer is encased by the first refractory metal layer, second refractory metal layer, and third refractory metal layer. To provide improved contact between the various metal layers, the interconnect line is then annealed at a temperature in a range from about 400° C. to about 450° C.

These and other features of the present invention will become more fully apparent from the following description and appended claims, or may be learned by the practice of the invention as set forth hereinafter.

BRIEF DESCRIPTION OF DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION

Figure 2:
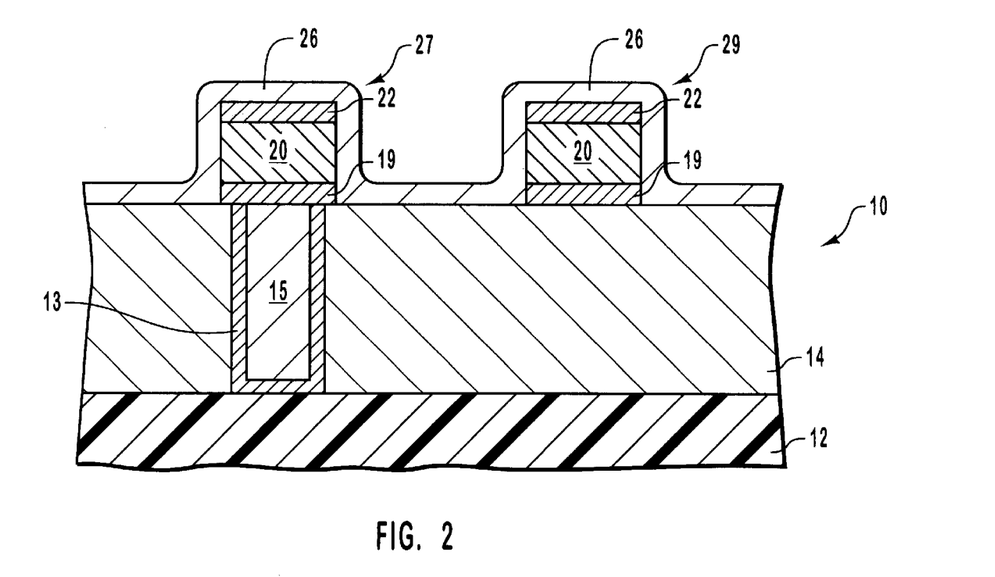
FIG. 2 is a cross-sectional view of a semiconductor substrate having a pair of metal lines, one of which is upon a contact plug, the pair of metal lines having an electrically conductive material conformally formed thereover.

FIG. 2 shows an embodiment of the invention where a semiconductor substrate 12, such as a silicon layer, has an insulating layer 14 thereon. Insulating layer 14 can be composed of a dielectric or insulator material. As used herein, dielectric or insulator material includes but is not limited to silicon dioxide (SiO2), a nitride material including silicon nitride, tetraethylorthosilicate (Si—OC2H5)4) (TEOS) based oxides, borophosphosilicate glass (BPSG), phosphosilicate glass (PSG), borosilicate glass (BSG), oxide-nitride-oxide (ONO), polyimide film, plasma enhanced silicon nitride (P-SiNx), titanium oxide, oxynitride, germanium oxide, a spin on glass (SOG), any chemical vapor deposited (CVD) dielectric including a deposited oxide, a grown oxide, and/or like dielectric materials. Additionally, depositing a layer of TEOS is to mean herein the deposition of a dielectric layer by decomposition of a gas in a reactor. Insulating layer 14 can also be composed of doped or undoped silicon dioxide.

Semiconductor structure 10 also includes interconnect lines 27 and 29. Each of interconnect lines 27 and 29 have a layer 19, a layer 20, and an antireflective coating (ARC) 22. Layer 19 can be composed of titanium nitride, titanium aluminide, or a combination of both a titanium layer and a titanium aluminide layer. Layer 20 is composed of aluminum. A layer 26 is formed over interconnect lines 27 and 29 so as to conform to the shape thereof. Layer 26 may be formed by CVD or by physical vapor deposition (PVD). Layer 26 can be composed of titanium nitride or titanium. Should layer 26 be composed of titanium then a heat treatment, such as an anneal step, can be conducted to transform layer 26 into titanium aluminide or a combination of titanium and titanium aluminide. The titanium aluminide is formed due to a reaction between the titanium layer 26 and the aluminum in layer 20.

Below interconnect line 27 is a contact plug 15 having thereover a liner 13. Contact plug 15 may be composed of aluminum or tungsten, and liner 13 can be composed of titanium nitride or the combination of titanium and titanium nitride. An active area will preferably be in semiconductor substrate 12 and in contact with contact plug 15 through liner 13.

Figure 3:
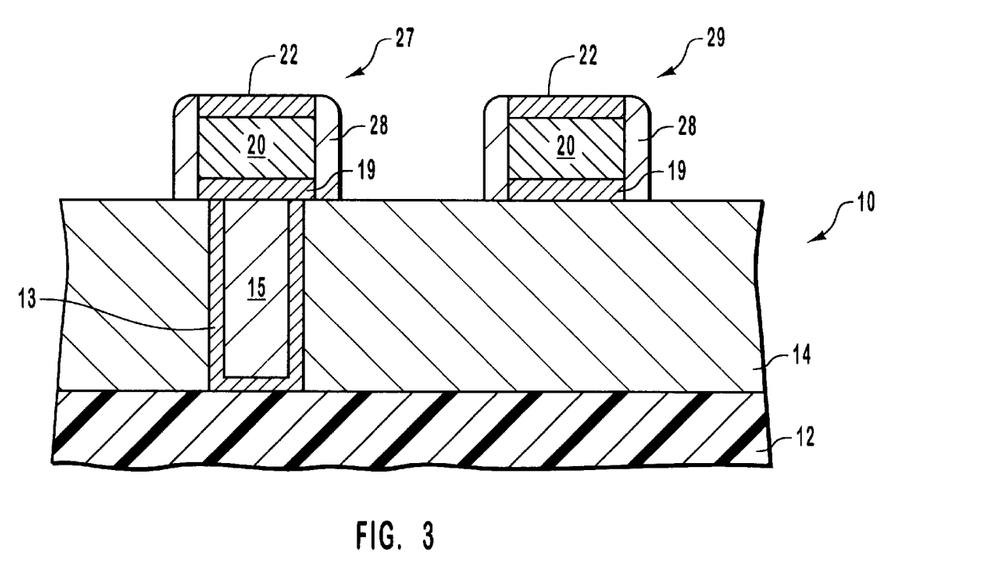
FIG. 3 is a cross-sectional view of the semiconductor substrate seen in FIG. 2 after a spacer etch forms spacers from the electrically conductive material on the pair of metal lines.

FIG. 3 shows the results of an anisotropic etch that is performed upon layer 26 that also exposes a top surface of ARC 22. This etch is a "spacer etch" that will preferably be a dry etch that is anisotropic and will remove layer 26 between interconnect lines 27 and 29 as seen in FIG. 3. An alternative embodiment of semiconductor structure 10 seen in FIG. 3 is a variation on materials where layers 20, 19, and 15 are all composed of aluminum.

In each of the foregoing examples where titanium aluminide is a portion of interconnect lines 27 or 29, it is intended that the titanium aluminide can be formed by a heat treatment of a titanium layer that is in contact with aluminum. Alternatively, titanium aluminide may be directly deposited by PVD or CVD. Additionally, contact plug 15 may be conventionally formed by deposition and reflow, high pressure and high temperature filling techniques, or other known process steps to insure proper formation of contact plug 15 in electrical communication with an active area within semiconductor substrate 12.

Importantly, the invention is directed to an interconnect line that is encased with electrically conductive material. Preferably, the interconnect line will be composed of aluminum and the encasing material will be a refractory metal, a refractory metal nitride, or an alloy of a refractory metal and aluminum. A further embodiment includes the foregoing interconnect line encased in electrically conductive material and situated upon a contact plug, where the contact plug makes an electrical connection to a active area in an underlying semiconductor substrate.

After the embodiment seen in FIG. 3 of semiconductor structure 10 has been formed, further and conventional processing may be performed upon semiconductor structure 10. For instance, a passivation or electrically insulating layer may be deposited over semiconductor structure 10 so as to cover over interconnect lines 27 and 29. As such, interconnect lines 27 and 29 will be electrically insulated one from the other above semiconductor substrate 12.

Figure 4:
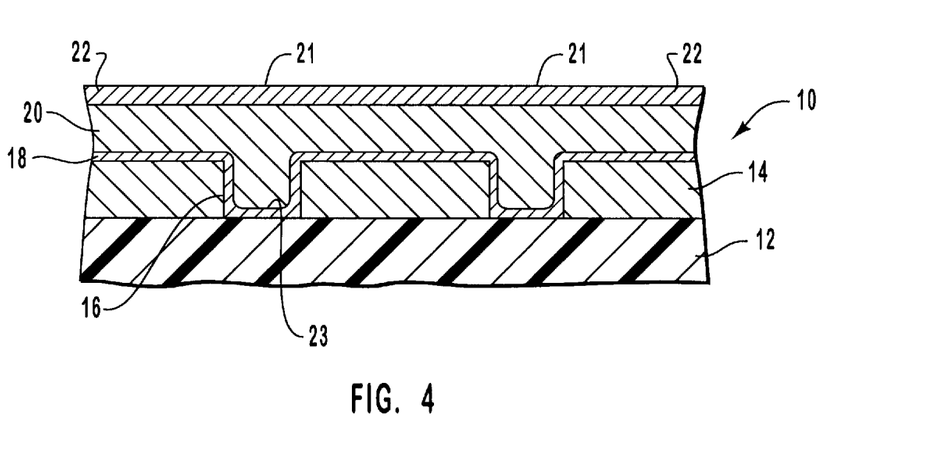
FIG. 4 is a cross-sectional view of a semiconductor substrate having a series of metal layers deposited thereon.

Depicted in FIG. 4 is a semiconductor structure 10 on which one embodiment of an inventive interconnect line can be formed that incorporates features of the present invention. Semiconductor structure 10 includes a semiconductor substrate 12 in which there is an active region. Although not specifically shown, the active region can be made to be in electrical communication with any of a plurality of electronic devices common to integrated circuits. By way of example and not limitation, such electronic devices include capacitors, resistors, transistors, diodes, and memory arrays.

Positioned in a blanket layer over semiconductor substrate 12 is an insulative layer 14. In the preferred embodiment, insulative layer 14 is a deposited oxide, silicon nitride, or a polyimide film. Once insulative layer 14 is formed, contact holes 16 are etched through insulative layer 14 to selectively expose semiconductor substrate 12. The present invention also envisions that the inventive interconnect lines can be used in the development of multilevel metal systems, in which case insulative layer 14 is often referred to as an intermetal dielectric layer.

Next, a conductive bottom metal layer 18 is deposited over the entirety of semiconductor structure 10. Conductive bottom metal layer 18 is electrically conductive, is preferably composed of a refractory metal such as titanium, and is most preferably composed of a refractory metal nitride such as titanium nitride. The deposition of conductive bottom metal layer 18 is typically accomplished by conventional processes such as vacuum evaporation, sputtering, or chemical vapor deposition techniques. The purpose of conductive bottom metal layer 18 in this embodiment is to form a wetting layer for flow of subsequent conductive metal layer 20 to contact hole 16, and to create a diffusion barrier layer between semiconductor substrate 12 and subsequent conductive metal layer 20.

An electrically conductive layer is next deposited over bottom metal layer 18 using one of the same types of deposition processes. Preferably, the electrically conductive layer will be composed of aluminum, such as aluminum layer 20 see in FIG. 4. Aluminum layer 20 has a top surface 21 and an opposing bottom surface 23.

Deposited over top surface 21 of aluminum layer 20 is a top metal layer 22. Top metal layer 22, which is preferably composed of a refractory metal or nitride thereof, is also deposited using conventional processes such as vacuum evaporation, sputtering or chemical vapor deposition techniques. Most preferably, top metal layer 22 is composed of titanium nitride.

Top metal layer 22 acts in part as an anti-reflective coating. Aluminum has fairly large grain boundaries that produce a relatively rough surface. During conventional photolithography processes the light reflects off of these grain boundaries and can produce notching in the aluminum. Top metal layer 22 is preferably chosen from a material, such as titanium nitride, that has good antireflective optical properties. As a result, minimal notching is formed in the final product. Top metal layer 22 can be omitted all together when a patterned organic antireflective coating (ARC) layer is used in a deep ultraviolet (DUV) lithographic process to define aluminum layer 20.

Figure 5:
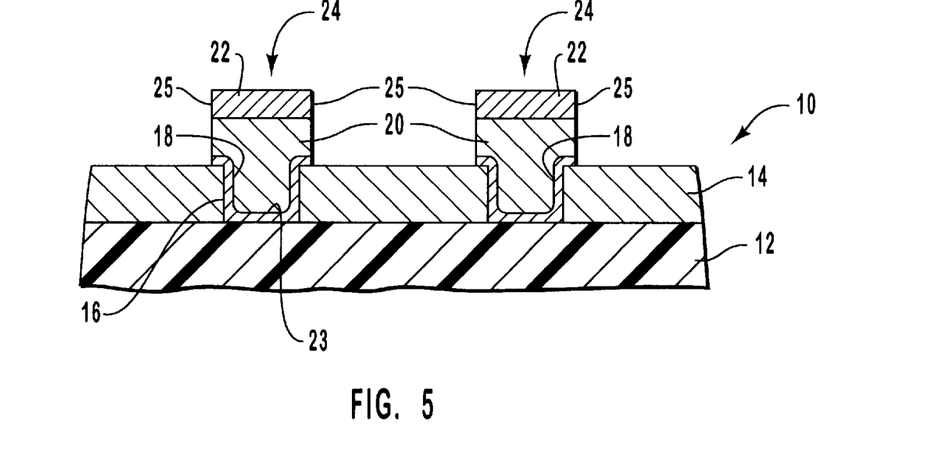
FIG. 5 is a cross-sectional view of a pair of aluminum interconnect lines formed from the metal layers in FIG. 4.

As shown in FIG. 5, the unwanted portions of layers 18, 20, and 22 are next removed by a conventional photo mask and etch processes, or by liftoff. This step leaves a thin interconnect line 24 extending above insulation layer 14 and in electrical communication with an active region within semiconductive substrate 12 through contact hole 16. Interconnect line 24 is in part defined by a pair of exposed opposing side surfaces 25 and an exposed top surface 27. Interconnect line 24 is used for delivering electrical currents within the integrated circuit. FIG. 5 also shows that a plurality of interconnect lines 24 can be simultaneously formed. In the preferred embodiment, interconnect line 24 is shown as comprising aluminum layer 20 being bounded on opposing sides by top metal layer 22 and bottom metal layer 18.

Alternatively, bottom metal layer 18 can be positioned between aluminum layer 20 and semiconductor substrate 12. In this position, bottom metal layer 18 acts as a barrier layer that prevents contact between aluminum layer 20 and the semiconductor material, such as silicon, of semiconductor substrate 12. Bottom metal layer 18, which functions as a barrier or wetting layer, is preferably made of titanium or a titanium alloy such as titanium-tungsten, titanium nitride, or tungsten nitride.

In one embodiment, aluminum layer 20 can be commercially available substantially pure aluminum. Aluminum layer 20 can also be an alloy of aluminum that includes from about 0.5% to about 4% copper. The alloys of aluminum and copper help to prevent or moderate electromigration within the aluminum as previously discussed. Aluminum layer 20 is preferably deposited at a deposition temperature that is in a range from about 200° C. to about 500° C.

As shown in FIG. 1, experimentally it is observed that stress voids and electromigration voids form in aluminum lines on the exposed aluminum side walls of the aluminum lines and not on the top of the line which is typically clad with titanium, titanium aluminide, or titanium nitride (e.g. ARC 22). This phenomena is due to the lower activation energy required to migrate vacancies under internal stress or within electrical fields when employing refractory metals or intermetallic materials. The present invention precludes the formation of such voids by creating a side wall spacers of refractory metal, refractory metal nitride, or refractory metal-aluminide intermetallic with voiding-resistant properties similar to the top surface of the aluminum line 20 that is clad with titanium nitride layer 22.

The particular materials used for layers 18 and 22 will depend on the situation and the type of voiding desired to be reduced. It is also envisioned that layers 18 and 22 could comprise multiple layers of different materials or that they could individually be separate materials, such as refractory metals and their nitrides. It has also been determined, however, that even the use of layers 18 and 22 does not totally preclude void formation as aluminum layer 20 continues to decrease in size. As such, further miniaturization of aluminum lines or interconnect lines has heretofore been precluded.

Figure 6:
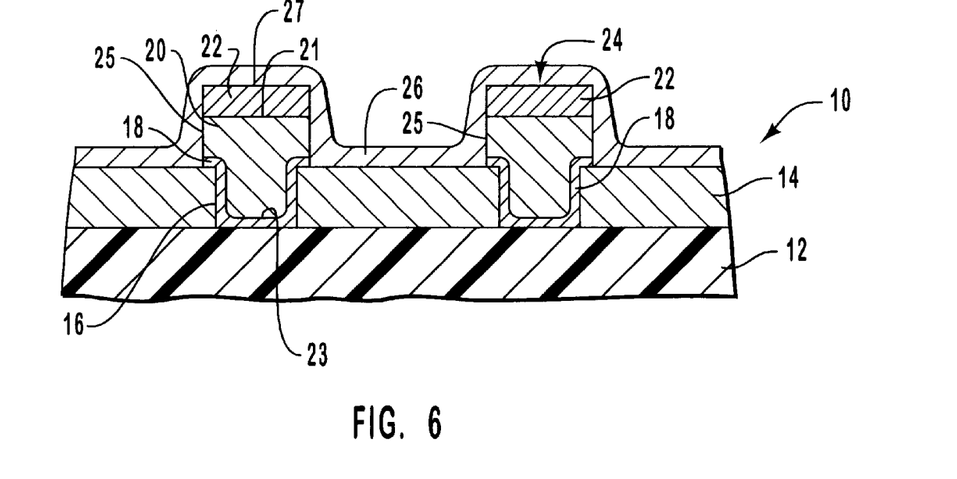
FIG. 6 is a cross-sectional view of the aluminum interconnect lines in FIG. 4 having a titanium blanket layer deposited thereon.

It is theorized that void formation occurs in smaller interconnect lines as a result of lateral void formation. With respect to the structure seen in FIGS. 5 and 6, layers 18 and 22 prevent or at least moderate void formation along top surface 21 and bottom surface 23 of aluminum layer 20 for the reasons discussed above. Aluminum layer 20 in interconnect line 24, however, has opposing side surfaces 25 that are openly exposed. As such, void formation is potentially able to grow laterally along aluminum layer 20. To prevent or moderate lateral void formation and thus to allow further miniaturization of interconnect line 24, FIG. 6 discloses depositing a conductive layer 26 over semiconductor structure 10 so as to cover interconnect line 24. Conductive layer 26 is shown as covering opposing side surfaces 25 of interconnect line 24.

Figure 7:
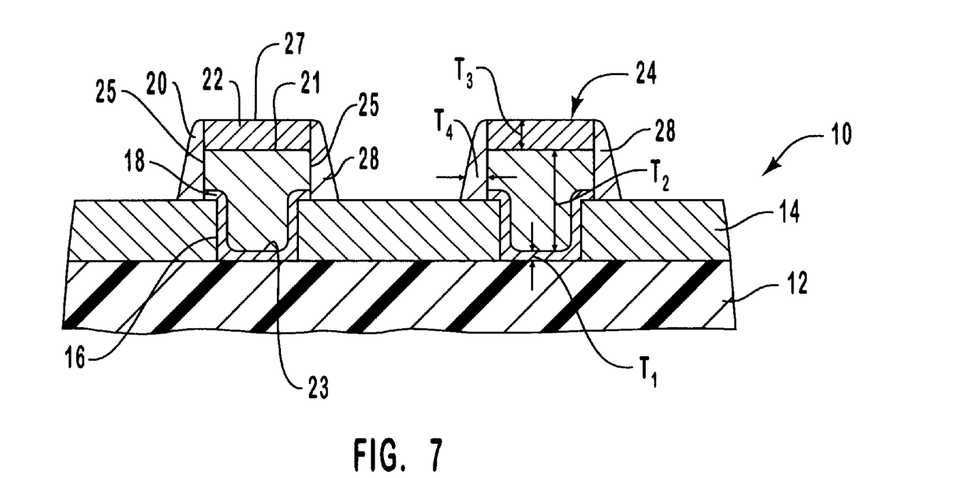
FIG. 7 is a cross-sectional view of the aluminum interconnect lines having the titanium layer of FIG. 6 removed except for on the sides of the aluminum interconnect lines.

After conductive layer 26 is deposited and optionally annealed, a conventional spacer etch is performed to produce the structure seen in FIG. 7, thereby removing all portions of conductive layer 26, except that portion positioned against side surfaces 25. The remnants of conductive layer 26 are referred to as sidewall spacers 28. In the preferred embodiment, conductive layer 26 and thus sidewall spacers 28 are formed of titanium or titanium nitride. Alternatively, other refractory metals that prevent void formation can also be used.

Sidewall spacers 28 function in the same way as metal layers 18 and 22 to eliminate void formation. That is, after sidewall spacers 28 are formed, an annealing step is used to secure the contact and to form an aluminum alloy free phase between aluminum layer 20 and sidewall spacers 28. As such, the aluminum atoms within the aluminum alloy free phase are more tightly bound, thereby reducing void formation.

The formation of sidewall spacers 28 can also be useful in subsequent manufacturing steps. In multiple level metal line systems, it is often necessary to cover the first set of interconnect lines with a dielectric, such as silicon dioxide. If side surfaces 25 of interconnect lines 24 are vertical, as shown in FIG. 5, it is more difficult for the dielectric material to fill in between adjacent interconnect lines 24. In contrast, by forming sidewall spacers 28, as discussed with FIG. 7, during an etch back procedure, the end at top surface 27 receives more ion bombardment so as to round off a corner of sidewall spacers 28. As a result, sidewall spacers 28 have a tapered configuration that increases in width from top surface 27 toward insulation layer 14.

As shown in FIG. 7, the preferred embodiment of the inventive interconnect line has an aluminum layer 20 that is entirely surrounded by titanium or titanium nitride. In one embodiment illustrative of the present invention, bottom metal layer 18 has a thickness T1 in a range between about 100 D to about 600 D. Aluminum line 20 can be formed having a thickness T2 greater than 4000 D, preferably greater than 3000 D, and more preferably greater than 2500 D. Top metal layer 22 has a thickness T3 in a range between about 100 D to about 300 D, with about 150 D to about 250 D being preferred. Finally, sidewall spacer 28 has a width T4 that varies in a range between about 100 D to about 600 D.

Figure 8:
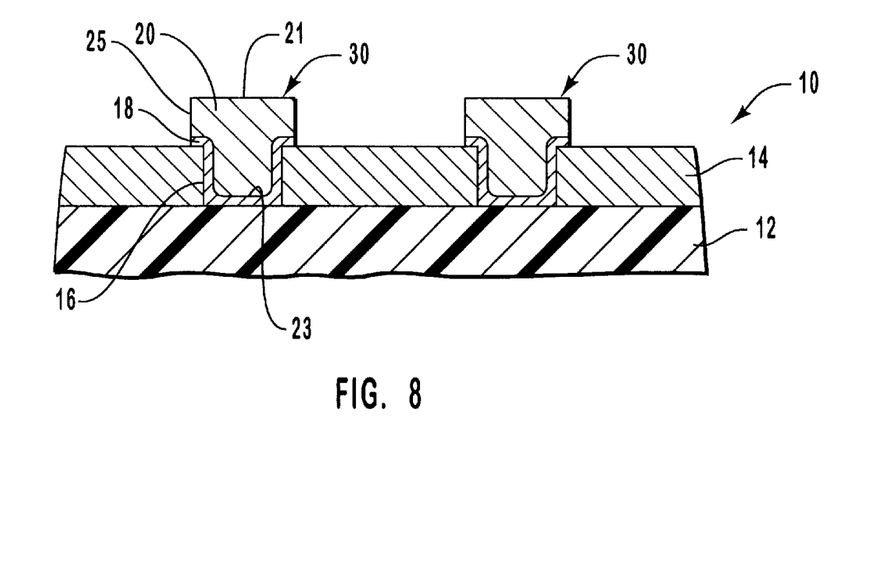
FIG. 8 is a cross-sectional view of the pair of aluminum interconnect lines in FIG. 5 without the top metal layer.

The above disclosure has described methods in which the inventive interconnect line can be obtained. There are, of course, alternative equivalent methods or steps that can be used to obtain the same results. For example, rather than depositing top metal layer 22 on top of aluminum layer 20, as shown in FIG. 4, an interconnect line 30 can be formed after aluminum layer 20 is deposited. As shown in FIG. 8, this is accomplished by using a conventional photoresist process to remove the unwanted portion of aluminum layer 20 and bottom metal layer 18. As such, interconnect line 30 comprises overlaid portions of bottom metal layer 18 and aluminum layer 20.

Figure 9:
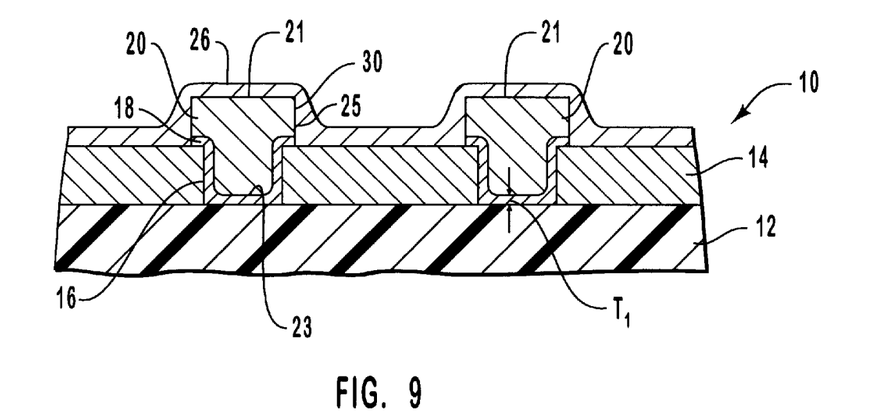
FIG. 9 is a cross-sectional view of the aluminum interconnect lines in FIG. 8 having a blanket titanium layer deposited thereon.
Figure 10:
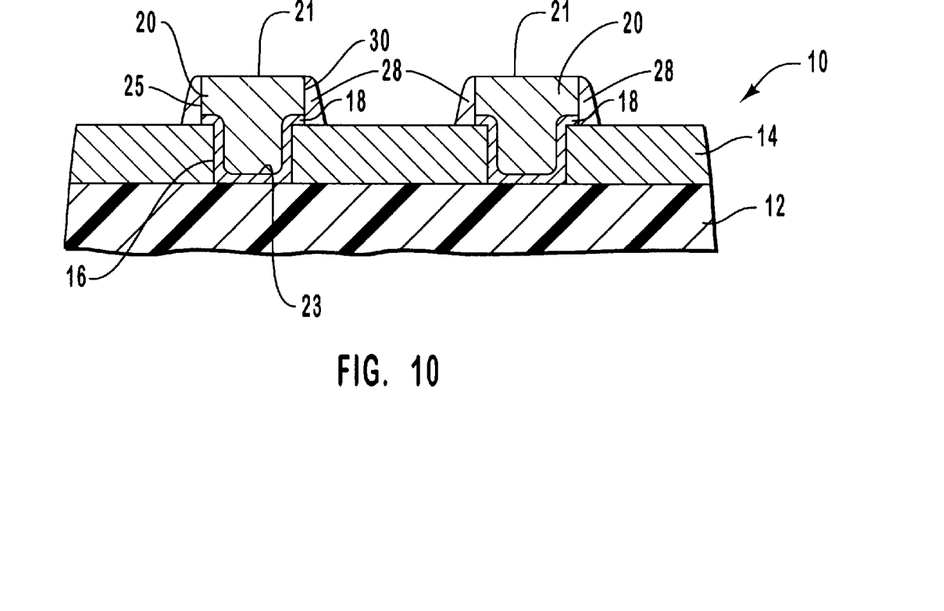
FIG. 10 is a cross-sectional view of the interconnect lines in FIG. 9 wherein a portion of the titanium layer not contacting the interconnect lines is removed.

As shown in FIG. 9, once interconnect line 30 is formed, metal layer 26 is deposited over semiconductor structure 10 so as to cover interconnect line 30, including aluminum layer 20. Where metal layer 26 is composed of a refractory metal, such as titanium, the titanium will react with aluminum layer 20 to form TiAl3, either during deposition or during a subsequent heat treatment. Next, as shown in FIG. 10, a spacer etch can be used to remove the portion of metal layer 26 not covering opposing side surfaces 25 of aluminum layer 20. Again, where metal layer 26 is composed of a refractory metal, the unreacted refractory metal of metal that remains between the lines is removed. In this embodiment, metal layer 26 forms sidewall spacers 28.

Figure 11:
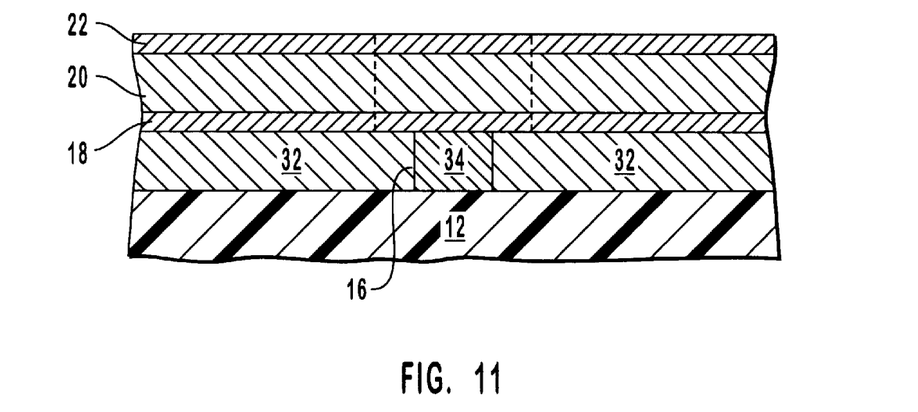
FIG. 11 is a cross-sectional view of a semiconductor substrate having a series of layers deposited thereon.

A further embodiment is depicted in FIGS. 11–14. As seen in FIG. 11, a semiconductor substrate 12 has thereon an insulator layer. The insulator is preferably composed of a doped silicon dioxide, such as borophosphosilicate glass (BPSG). By way of example of the same, a BPSG layer 32 is seen in FIG. 11. A trench 16 is defined in BPSG layer 32. Trench 16 has a tungsten material 34 formed therein.

Next, a conductive bottom metal layer 18 is deposited over BPSG layer 32 and trench 16. An electrically conductive layer is next deposited over bottom metal layer 18. Preferably, the electrically conductive layer will be compose of aluminum, such as an aluminum layer 20 see in FIG. 11.

Deposited over aluminum layer 20 is a top metal layer 22. Top metal layer 22 is also deposited using conventional processes such as vacuum evaporation, sputtering or chemical vapor deposition techniques. As shown in phantom in FIG. 11, layers 18, 20, and 22 are patterned for a subsequent material removal process. Such a pattern can be accomplished using conventional photolithography.

Figure 12:
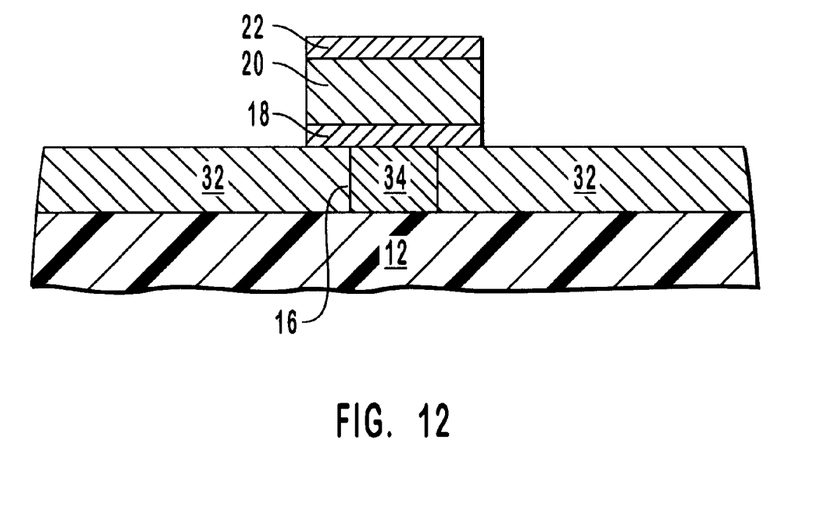
FIG. 12 is a cross-sectional view of the structure seen in FIG. 11 after further processing of patterning to form a metal line stack.
Figure 13:
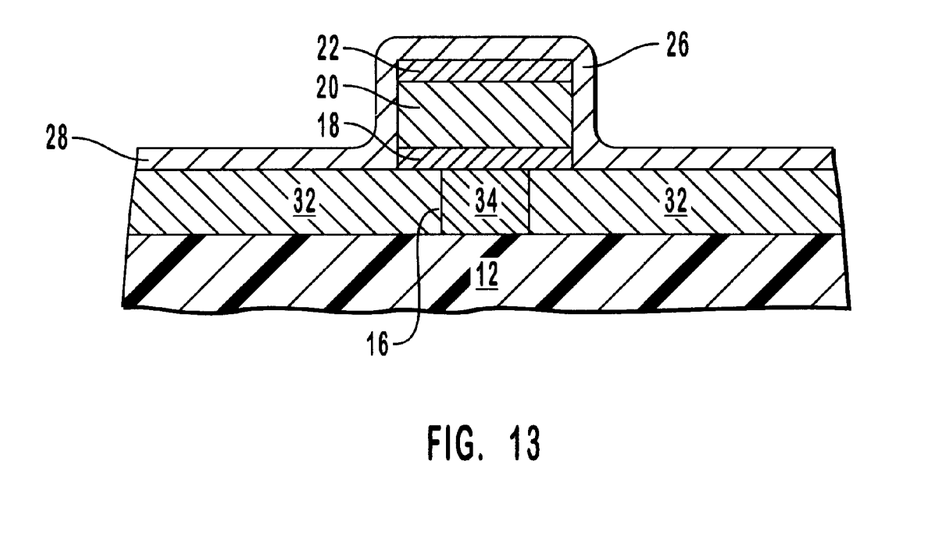
FIG. 13 is a cross-sectional view of the structure seen in FIG. 12 after further processing of forming a spacer material over the metal line stack.
Figure 14:
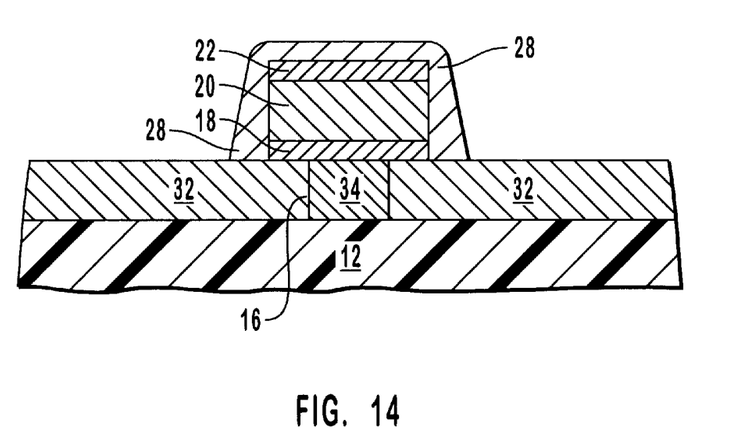
FIG. 14 is a cross-sectional view of the structure seen in FIG. 13 after further processing of a spacer etch to form spacers upon lateral sides of the metal line stack.

In FIG. 12, a metal line stack has been formed by conventional processing. The metal line stack includes layers 18, 20, and 22. In FIG. 13, a layer of spacer material 26 is deposited over the metal line stack of layers 18, 20, and 22. A spacer etch is performed so as to form spacers 28 upon the lateral sides of layers 18, 20, and 22. After the spacer etch, spacer material 26 is removed from a top surface of top metal layer 22 as shown in FIG. 14.

Figure 15:
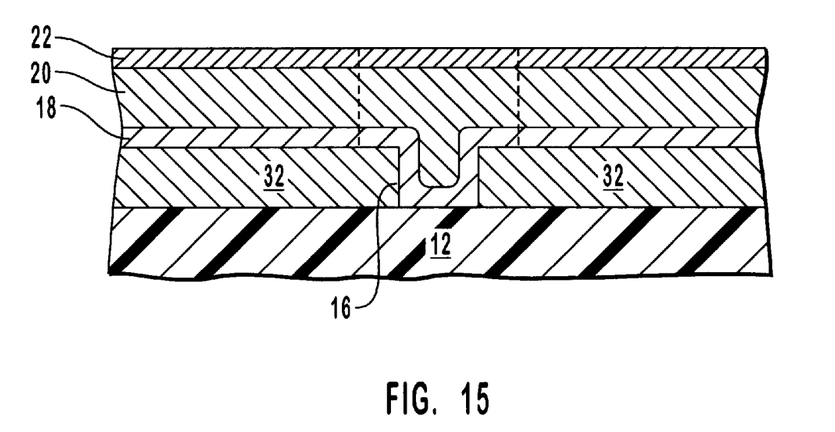
FIG. 15 is a cross-sectional view of a semiconductor substrate having a series of layers deposited thereon and within a recess on an insulation layer.
Figure 16:
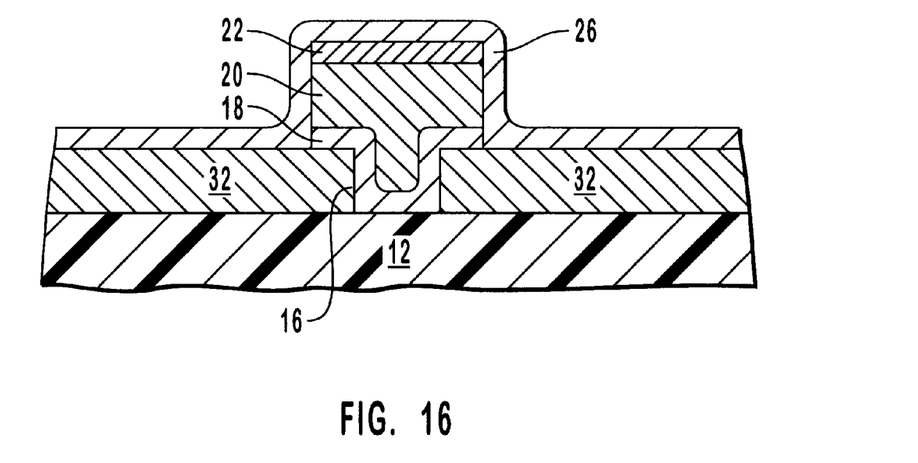
FIG. 16 is a cross-sectional view of the structure seen in FIG. 15 after further processing of patterning to form a metal line stack and then forming a spacer material over the metal line stack.
Figure 17:
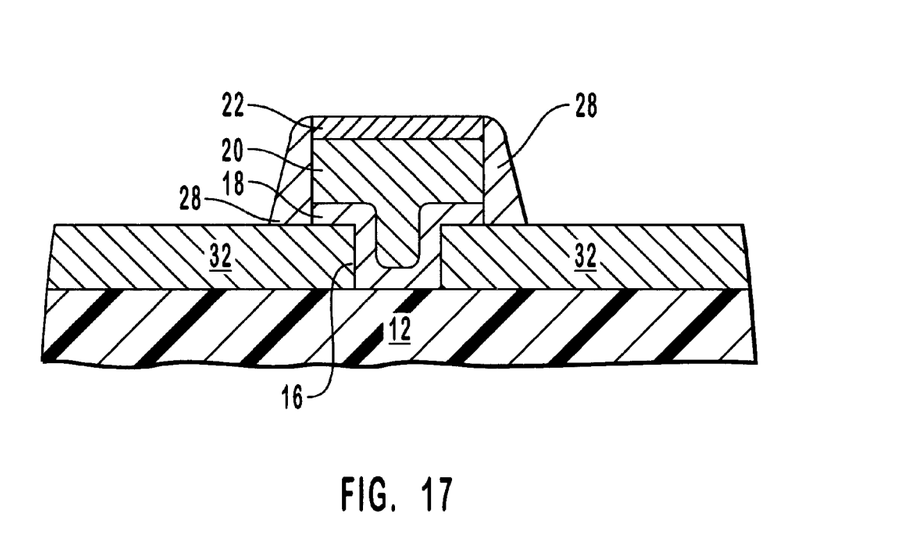
FIG. 17 is a cross-sectional view of the structure seen in FIG. 16 after further processing of a spacer etch to form spacers upon lateral sides of the metal line stack.

A still further embodiment is depicted in FIGS. 15–17. As seen in FIG. 15, a semiconductor substrate 12 has thereon an insulator layer. The insulator layer is preferably composed of a doped silicon dioxide, such as borophosphosilicate glass (BPSG). By way of example of the same, a BPSG layer 32 is seen in FIG. 15. A trench or contact 16 is defined in BPSG layer 32. A conductive bottom metal layer 18 is deposited as a liner within trench 16 as well as over BPSG layer 32. An electrically conductive layer is next deposited over bottom metal layer 18 and within trench 16. Preferably, the electrically conductive layer will be composed of aluminum, such as an aluminum layer 20 see in FIG. 15.

Deposited over aluminum layer 20 is a top metal layer 22. Top metal layer 22 is also deposited using conventional processes such as vacuum evaporation, sputtering or chemical vapor deposition techniques. As shown in phantom in FIG. 15, layers 18, 20, and 22 are patterned for a subsequent material removal process. Such a pattern can be accomplished using conventional photolithography. When DUV lithography is used, top metal layer 22 is not needed, as explained above.

In FIG. 16, a metal line stack has been formed by conventional processing using the pattern as described. The metal line stack includes layers 18, 20, and 22. In FIG. 16, a layer of spacer material 26 is deposited over the metal line stack of layers 18, 20, and 22. A spacer etch is performed so as to form spacers 28 upon the lateral sides of layers 18, 20, and 22 as shown in FIG. 17. After the spacer etch, none of spacer material 26 is left upon a top surface of top metal layer 22.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of forming an interconnect line structure, the method comprising:

forming a first refractory metal layer upon an electrically insulative substrate;

forming a metal layer upon the first refractory metal layer, the metal layer having a top surface;

forming co-planar opposing side walls on the first refractory metal layer and the metal layer;

forming a second refractory metal layer conformally upon the metal layer and the first refractory metal layer; and forming spacers from the second refractory metal layer so as to cover the co-planar opposing side walls on the first refractory metal layer and the metal layer without covering the top surface of the metal layer.

2. The method as defined in claim 1, wherein the first and second refractory metal layers each comprise a refractory metal nitride.

3. The method as defined in claim 1, wherein the first and second refractory metal layers each comprise titanium nitride.

4. The method as defined in claim 1, wherein the first refractory metal layer comprises a film of titanium and a film of titanium nitride.

5. The method as defined in claim 1, wherein the first refractory metal layer comprises a film of titanium and a film of an alloy of titanium and aluminum.

6. The method as defined in claim 1, wherein the first and second refractory metal layers each comprise an alloy of titanium and aluminum.

7. The method as defined in claim 1, wherein: the metal layer comprises a material selected from the group consisting of aluminum and an aluminum alloy; and the electrically insulative substrate comprises silicon dioxide.

8. A method for forming an electrically conductive line on a semiconductor substrate, the method comprising:

forming a first refractory metal nitride layer over the semiconductor substrate;

forming a metal layer over said first refractory metal nitride layer, said metal layer having a top surface;

removing portions of said first refractory metal nitride layer and said metal layer to form an interconnect line composed of remaining portions of said first refractory metal nitride layer and said metal layer, said interconnect line having opposing side surfaces comprising opposing side walls on the first refractory metal nitride layer and the metal layer;

forming a second refractory metal nitride layer on the semiconductor substrate to cover said interconnect line, a portion of said second refractory metal nitride layer being upon said top surface of said metal layer and said side surfaces of said interconnect line; and removing said second refractory metal nitride layer except for said portion upon said side surfaces of said interconnect line to form spacers that cover the opposing side walls of the first refractory metal nitride layer and the metal layer.

9. The method as defined in claim 8, further comprising annealing said first and second refractory metal nitride layers and said metal layer.

10. The method as defined in claim 8, wherein the first and second refractory metal nitride layers each comprise a material selected from the group consisting of:
titanium nitride; and
an alloy of titanium and aluminum.

11. The method as defined in claim 8, wherein the first refractory metal nitride layer comprises a structure selected from the group consisting of:
a film of titanium and a film of titanium nitride; and
a film of titanium and a film of an alloy of titanium and aluminum.

12. The method as defined in claim 8, wherein:
the metal layer comprises a material selected from the group consisting of an aluminum alloy and aluminum.

13. A method for forming an electrically conductive line on an insulative layer, the method comprising:

forming a first refractory metal nitride layer over the insulative layer;

forming a metal layer over said first refractory metal nitride layer, said metal layer having a top surface;

forming an antireflective coating layer upon the metal layer;

patterning said antireflective coating layer in a photolithographic process to form a pattern therein;

removing portions of said first refractory metal nitride layer and said metal layer through the pattern in said antireflective coating layer to form an interconnect line composed of remaining portions of said first refractory metal nitride layer and said metal layer, said interconnect line having opposing side surfaces where said metal layer and said first refractory metal nitride layer are exposed, said interconnect line having a top surface;

forming an electrically conductive spacer material upon the top surface of said interconnect line and the opposing side surfaces of said interconnect line; and removing said spacer material upon the top surface of said interconnect line to form spacers that cover the opposing side surfaces where said metal layer and said first refractory metal nitride layer were previously exposed.

14. The method as defined in claim 13, further comprising annealing said first refractory metal nitride layer and said metal layer.

15. The method as defined in claim 13, wherein:
the first refractory metal nitride layer is a structure selected from the group consisting of:
titanium and titanium nitride;
titanium and an alloy of titanium and aluminum; and
an alloy of titanium and aluminum;
the electrically conductive spacer material is selected from the group consisting of:
a refractory metal nitride;
titanium nitride; and
an alloy of titanium and aluminum;
the metal layer comprises a material selected from the group consisting of aluminum and an aluminum alloy; and
the insulative layer comprises silicon dioxide.

16. A method for forming an electrically conductive line on a semiconductor substrate, the method comprising forming a first titanium nitride layer over the semiconductor substrate;

forming an aluminum layer over said first titanium nitride layer, said aluminum layer having a top surface;

forming an organic antireflective coating layer upon the aluminum layer;

patterning said organic antireflective coating layer in a photolithographic process to form a pattern therein;

removing portions of said first titanium nitride layer and said aluminum layer through the pattern in said organic antireflective coating layer to form an interconnect line composed of remaining portions of said first titanium nitride layer and said aluminum layer, said interconnect line having opposing side surfaces where said aluminum layer and said first titanium nitride layer are exposed, said interconnect line having a top surface;

forming a spacer material upon the opposing side surfaces of said interconnect line, the spacer material covering the opposing side surfaces where said aluminum layer and said titanium nitride layer are exposed; and annealing said first titanium nitride layer and said aluminum layer.

17. A method for forming an electrically conductive line on a semiconductor substrate, the method comprising:

forming a first titanium nitride layer over the semiconductor substrate;

forming an aluminum layer over said first titanium nitride layer;

forming a second titanium nitride layer over said aluminum layer;

removing portions of said first titanium nitride layer, said aluminum layer, and said second titanium nitride layer to form an interconnect line composed of remaining portions of said first titanium nitride layer, said aluminum layer, and said second titanium nitride layer, said interconnect line having opposing side surfaces where said aluminum layer and said first and second titanium nitride layers are exposed;

forming a third titanium nitride layer on the semiconductor substrate to cover said interconnect line, a portion of said third titanium nitride layer being upon said side surfaces of said interconnect line;

removing said third titanium nitride layer, except for said portion upon said side surfaces of said interconnect line, to form spacers that cover the opposing side surfaces where said aluminum layer and said first and second titanium nitride layers were previously exposed; and annealing said first, second, and third titanium nitride layers and said aluminum layer.

18. A method for forming an electrically conductive line on a semiconductor substrate, the method comprising:

forming a first titanium nitride layer over the semiconductor substrate;

forming an aluminum layer over said first titanium nitride layer;

forming an antireflective coating layer upon the aluminum layer;

patterning said antireflective coating layer to form a pattern therein;

removing portions of said first titanium nitride layer and said aluminum layer through the pattern in said antireflective coating layer to form an interconnect line composed of remaining portions of said first titanium nitride layer and said aluminum layer, said interconnect line having opposing side surfaces where said aluminum layer and said first titanium nitride layer are exposed;

forming a second refractory metal layer on the semiconductor substrate to cover said interconnect line, a portion of said second refractory metal layer being upon said side surfaces of said interconnect line;

removing said second refractory metal layer, except for said portion of said second refractory metal layer upon said side surfaces of said interconnect line, to form spacers that cover the opposing side surfaces where said aluminum layer and said first titanium nitride layer were previously exposed; and annealing said titanium nitride layer, said second refractory metal layer, and said aluminum layer.

* * * * *

UNITED STATES PATENT AND TRADEMARK OFFICE
CERTIFICATE OF CORRECTION

PATENT NO.    : 6,544,871 B1
DATED         : April 8, 2003
INVENTOR(S)   : Jeffrey W. Honeycutt It is certified that error appears in the above-identified patent and that said Letters Patent is hereby corrected as shown below:

<u>Title page,</u>
*Assistant Examiner–* change "Pho M. Luy" to -- Pho M. Luu --

<u>Column 2,</u>
Line 43, after "combination" change "and" to -- of --
Line 46, before "aluminum" insert -- of --

<u>Column 7,</u>
Line 2, after "layer 20" change "see" to -- seen --
Line 65, change "spacers" to -- spacer --

<u>Column 9,</u>
Line 43, after "layer 20" change "see" to -- seen --

<u>Column 10,</u>
Line 3, after "layer 20" change "see" to -- seen --
Line 25, change "illustrated" to -- illustrative --

<u>Column 12,</u>
Line 20, change "comprising" to -- comprising: --

Signed and Sealed this

Twelfth Day of August, 2003

JAMES E. ROGAN
*Director of the United States Patent and Trademark Office*